United States Patent
Yamamoto et al.

[19]

[11] Patent Number: 5,967,811
[45] Date of Patent: Oct. 19, 1999

[54] MEMORY CARD CONNECTOR

[75] Inventors: Yoshihisa Yamamoto, Yokohama; Satoru Watanabe, Tokyo, both of Japan

[73] Assignee: The Whitaker Corporation, Wilmington, Del.

[21] Appl. No.: 09/043,275

[22] PCT Filed: Sep. 5, 1996

[86] PCT No.: PCT/US96/14207

§ 371 Date: Mar. 12, 1998

§ 102(e) Date: Mar. 12, 1998

[87] PCT Pub. No.: WO97/10691

PCT Pub. Date: Mar. 20, 1997

[51] Int. Cl.[6] .................................................. H01R 13/62
[52] U.S. Cl. ................................................ 439/159
[58] Field of Search ....................................... 439/159

[56] References Cited

U.S. PATENT DOCUMENTS 5,179,871  1/1993  Orimoto et al. .
5,383,789  1/1995  Watanabe .............................. 439/159
5,466,166  11/1995  Law et al. ............................ 439/159
5,533,906  7/1996  Abe ...................................... 439/159

FOREIGN PATENT DOCUMENTS 0 532 346 A2  9/1992  European Pat. Off. ........ H01R 23/68
0 644 624 A2  9/1994  European Pat. Off. ...... H01R 13/633
6-243299  of 1994  Japan ............................ G06K 17/00
6-37947  5/1994  Japan ............................ G06K 17/00
WO 95/30205  4/1995  WIPO ........................... G06K 13/08

*Primary Examiner*—Neil Abrams
*Assistant Examiner*—Javaid Nasri

[57] ABSTRACT

A memory card connector comprises a frame (20) for receiving a memory card (12) therein, an actuating member (40) slidably mounted along one side of the frame, a card-ejection member (60, 110) pivotally mounted onto the frame at an inner end thereof and having one end (62) connected to an inner end of the actuating member (40) and another end (64) in the form of an ejecting section for engagement with the memory card to eject the memory card from the frame upon pivotal movement of the card-ejection member by the actuating member wherein the card-ejection member has a floating axis of rotation (28, 66) and a secondary axis of rotation (30, 68; 112, 128).

9 Claims, 4 Drawing Sheets

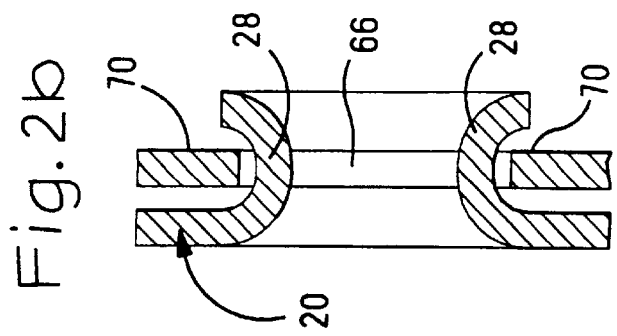
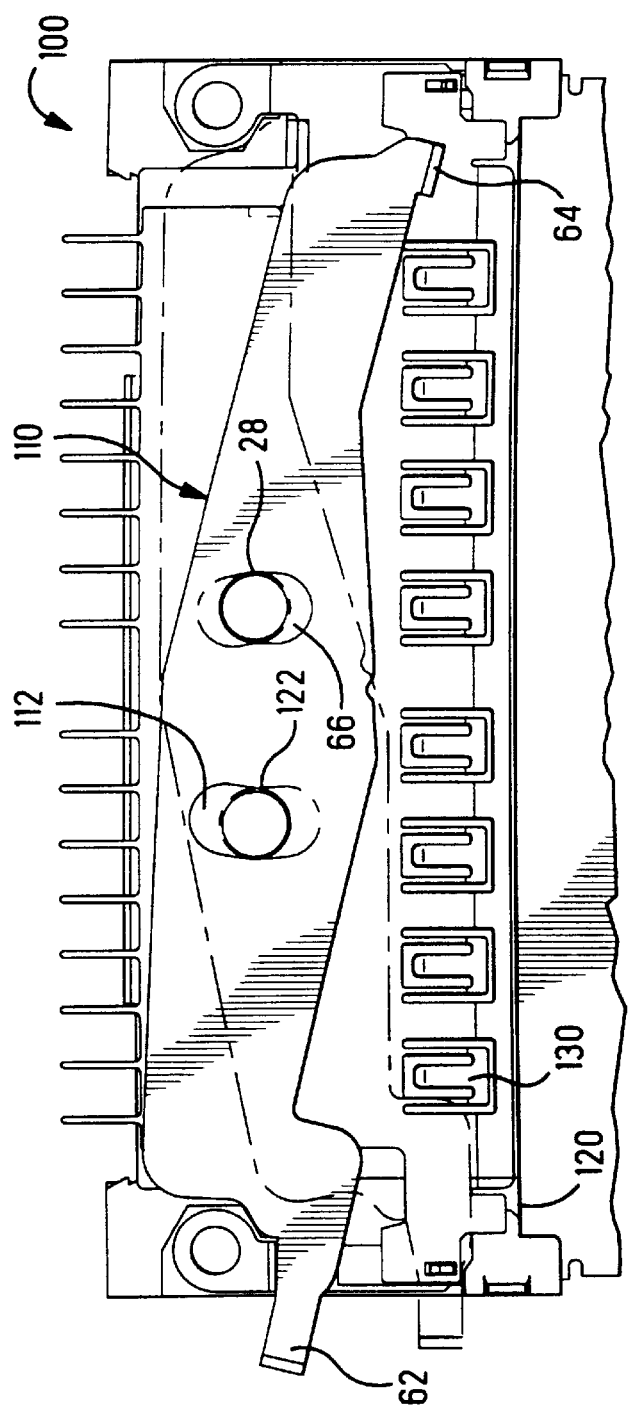
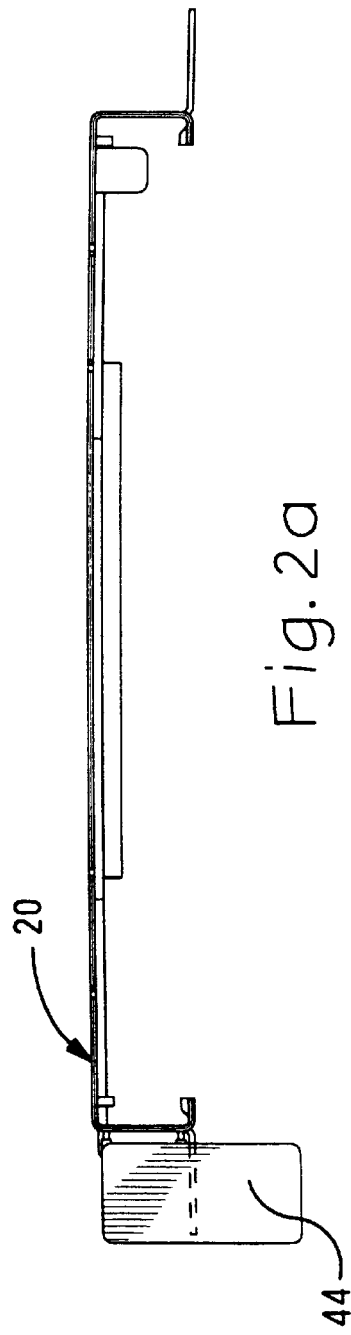

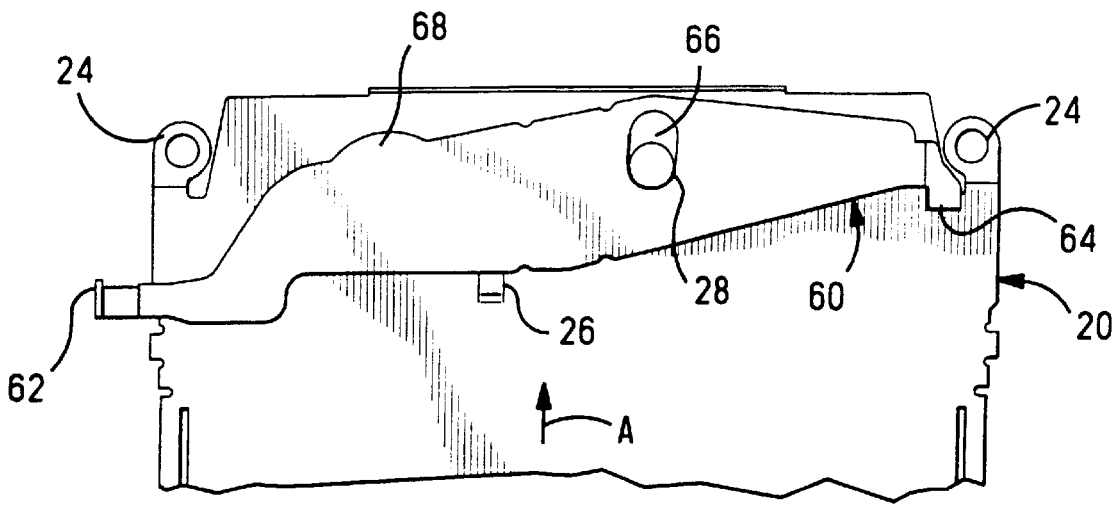
Fig. 3
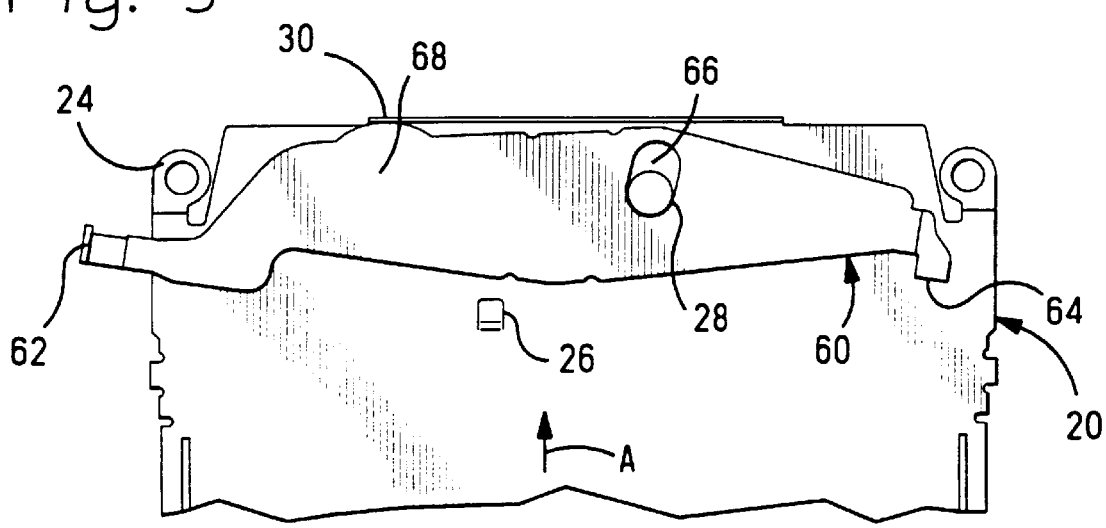
Fig. 4
Fig. 5
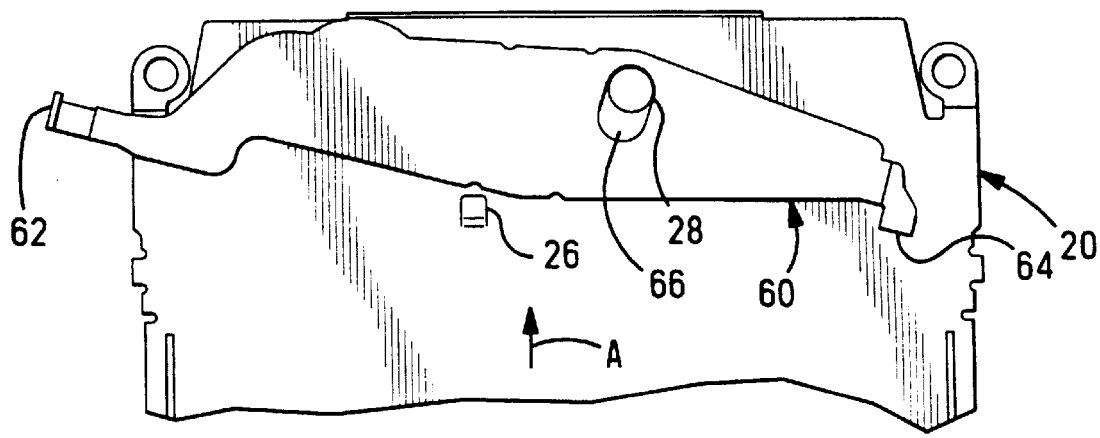

MEMORY CARD CONNECTOR

FIELD OF THE INVENTION

This invention relates to a memory card connector for receiving a memory card and electrical connection with circuit boards.

BACKGROUND OF THE INVENTION

Printed circuit cards incorporating integrated circuits are widely used in personal computers and similar devices and are known as memory cards. Printed circuit cards can be used in special card terminals equipped with memory card connectors. Such memory card connectors normally include an actuating member reciprocably sliding in the direction of card insertion and ejection and a card-ejection member having one end that ejects the card inserted in the memory card connector when the card-ejection member is rotated by the action of the actuating member applied to the other end of the card-ejection member.

Such memory card connectors equipped with an activating member and card-ejection member are described for example in Japanese Patent Publication No. 94-243299 and Japanese Utility Model Publication No. 94-37947.

In order to enhance the operational capability of the card-ejection members described in these publications to eject a printed circuit card inserted in the memory card connector, they have two protrusions formed on the front edge of the card-ejection members facing the card insertion direction. These two protrusions play the role of sequential fulcrums in response to the rotational or pivotal movement of the front edge of the card-ejection member produced for the purpose of card ejection.

As mentioned above, these fulcrums in the form of the protrusions engage the card. In some cases, this engagement takes place in an inconvenient location, and as a result the fulcrums can shift from their required positions. When such a shift occurs, it becomes impossible to produce appropriate forces required for the ejection of the printed circuit card from the memory card connector, thereby resulting in an insufficient ejection of the card. There also exists a danger that the card-ejection member can be bent. If an attempt is made to continue to move card-ejection member in such a condition, it may rub against a plate located adjacent the card-ejection member resulting in damage thereto. In order to prevent the separation of the card-ejection member from the frame, a portion of the frame is bent to a C-shaped configuration which secures the entire card-ejection member. Therefore, the frame shape is very complicated for the fabrication thereof, while it is still impossible to prevent the lifting of the card-ejection member from the frame.

SUMMARY OF THE INVENTION

Considering the above-mentioned situation, the purpose of this invention is to provide a memory card connector which provides sufficient and accurate ejection of the card from the memory card connector.

In order to achieve the purposes stated above, a memory card connector comprises a frame intended for the insertion thereinto of a flat memory card; an insulating housing fixed at an end of the frame opposite to an end for the card insertion which is intended for the reception of a card inserted in the frame; an actuating member movably mounted to the left or right side of the frame in such a manner that it can move in the direction of insertion; and a card-ejection member located perpendicularly to the direction of insertion with one end being connected to the front end (when looking in the direction of insertion) of the actuating member and the other end being pressed against the front edge (looking in the direction of insertion) of the memory card retained in the frame and insulating housing making it possible to push out the memory card inserted in the frame when the card-ejection member is rotated as a result of moving the actuating member in the direction of insertion, wherein the card-ejection member has a primary floating axis of rotation for the initial period of rotation which is located inside an elongated opening located in the area of the other end of the card-ejection member, and a secondary axis of rotation located near the first end of the card-ejection member at its front edge around which the card-ejection member is rotated at the second stage of rotary motion.

It is preferable to provide a second floating rotation axis located in an elongated opening located in the area of the first end of the card-ejection member of the rotation axis for the second stage of rotation.

A memory card connector comprises a frame having a card-receiving area for receiving a memory card therein, an actuating member slidably mounted along one side of the frame, a card-ejection member pivotally mounted onto the frame at an inner end thereof and having one end connected to an inner end of the actuating member and another end in the form of an ejecting section for engagement with the memory card to eject the memory card from the frame upon pivotal movement of the card-ejection member by the actuating member, wherein the card-ejection member has a floating axis of rotation provided between the frame and the card-ejection member for an initial stage of rotation; and a secondary axis of rotation provided between the frame and the card-ejection member for a second stage of rotation.

Embodiments of the invention will now be described by way of example with reference to the accompanying drawings.

BRIEF DESCRIPTION OF THE DRAWINGS

FIG. 2a is a front view of the memory card connector of FIG. 1.

FIG. 2b is a cross-sectional view taken along line 2b—2b of FIG. 1a.

FIG. 3 shows the position of the card-ejection member when a memory card is inserted into the memory card connector.

FIG. 4 shows the position of the card-ejection member when the memory card is beginning to be ejected.

FIG. 5 shows the position of the card-ejection member after the memory card has been ejected.

FIG. 9 is an enlarged view showing an embodiment of the card-ejection member of the present invention.

DETAILED DESCRIPTION OF AN EMBODIMENT OF THE INVENTION

Figure 1C:
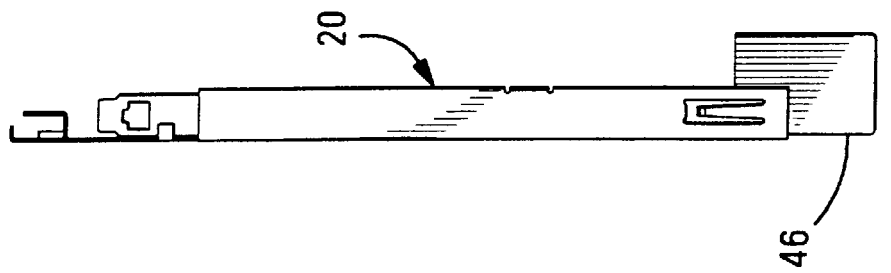
FIGS. 1a, 1b and 1c are top plan, left side and right side views, respectively, of a memory card connector of the present invention.

Card connector 10 comprises a thin metal frame 20 into which a flat memory card 12 is inserted in the direction shown by arrow A and an electrical connector including an insulating housing (not shown) secured in the back of frame 20. Memory card 12 inserted in the frame 20 is accommodated in the insulating housing. Along the left edge of the frame 20 are located bent sections 22 within which is reciprocally mounted actuating member 40. In addition, frame 20 has mounting members 24 intended for the mounting to a base or circuit board (not shown) of the memory card connector 10. Actuating member 40 is normally maintained at an outer position by spring 50 whose one end 52 is attached to a location slightly behind the front end 42 of the actuating member 40 and the other end 54 is secured to the frame 20. Because of this, actuating member 40 is always retracted by the spring 50 to the original position opposite to the direction of insertion. To the other or back end of the actuating member 40 is mounted a button 44 which is intended for engagement to operate the actuating member 40. In addition to the actuating member 40 and related components, the memory card connector 10 comprises a card-ejection member 60 which is placed transversely in relation to the direction of card insertion and whose one end 62 is connected to the front end 42 of the actuating member 40, and the other end constituting an ejecting section 64 engages the memory card inserted in the insulating housing. When the actuating member 40 is pushed in the direction of insertion, the ejecting section 64 of card-ejection member 60 rotates in the direction opposite to that of the insertion and ejects memory card 12 inserted in the frame 20.

Card-ejecting member 60 has an elongated opening extending in the general direction of insertion and an arcuate protrusion 68 extending in the direction of insertion from the front end of the card-ejection member 60. As illustrated in FIG. 2b, a portion of frame 20 is rolled inwardly forming an offset shoulder 28 enclosing an edge 70 of the opening 66 in the card-ejection member 60. Since this offset shoulder 28 is of a rather low profile, it can freely float inside the elongated opening 66. It also prevents the card-ejection member 60 from being separated from the frame or being tilted. On the other hand, since the opening 66 is elongated in the general direction of insertion, this offset shoulder limits movement of the card-ejection member 60 in the direction transverse to the direction of insertion, and the movement of the card-ejection member 60 in a direction of insertion is limited to the length of the elongated opening 66. Therefore, the card-ejection member 60 makes no unnecessary or wobbly movement when the ejecting section 64 of the card-ejection member 60 is rotated in response to the motion of the actuating member 40 in the direction of insertion.

Another member limiting movement of the card-ejection member 60 is a stop member 26 formed in the frame 20. As mentioned above, one end 62 of the card-ejection member 60 is connected to the front end 42 of the actuating member 40 which is at all times retracted by the spring 50 to the position opposite to the direction of insertion. When a force applied to the actuating member 40 is released after the memory card 12 inserted in the frame and insulating housing is ejected by pushing the actuating member 40 against the force produced by spring 50, the actuating member 40 is returned to its initial position by the spring force generated by spring 50. When the actuating member 40 is being returned to its original position, the card-ejection member 60 moves in the direction opposite to that of insertion, but the stop member 26 prevents abrupt movement thereof.

Below, movement of the card-ejection member 60 using FIGS. 3 through 8 for reference will be explained. For the purpose of clarity of explanation, the actuating member, memory card and other components are omitted from FIG. 3–8.

FIG. 3 represents the situation when the card is inserted in the frame 20 and insulating housing. As shown by FIG. 3, the offset shoulder 28 is at the rear end of the elongated opening 66 when looking in the direction of insertion. The card-ejection member 60 is also in engagement with the stop member 26. In this position, the memory card is inserted in the frame and insulating housing wherein it is retained by the electrical contacts forming a rather strong electrical connection therewith. Because of this, in order to eject the memory card from the insulating housing, it is necessary to apply a considerable force.

At the initial stage of the card ejection, the actuating member 40 (see FIG. 1) is pressed in the direction of insertion and, as shown in FIG. 4, the first end 62 of the card-ejection member 60 starts to move in the direction of insertion, and the ejecting section 64 starts to rotate around the offset shoulder 28. The distance between the first end 62 and the offset shoulder 28 is larger than the distance between the ejecting section 64 and the offset shoulder 28. Because of this, the distance (stroke) traveled by the ejecting section 64 is short and the force applied by it to the memory card is larger than the force applied to the actuating member 40, thereby making it possible to easily eject the memory card from the insulating housing and frame 20. Moreover, the offset shoulder 28 plays the role of the rotation axis until the arcuate protrusion 68 engages with a wall 30 of the frame 20, after which the rotation continues around the point of contact between the arcuate protrusion 68 and the wall 30.

When the actuating member 40 is pressed further in the direction of insertion, the ejection of the memory card enters a second stage. As illustrated in FIG. 5, at this time the axis of rotation is the engagement between the arcuate protrusion 68 and the wall 30. This means that during the second stage of the rotation of the ejection section 64, the axis of rotation is transferred to the engagement between the arcuate protrusion 68 and the wall 30. The point of this engagement is located in the area of the first end of the card-ejection member 60, and the distance between the engagement point and the first end 62 is shorter than the distance between the engagement point and the ejecting section 64. Therefore, the memory card can be ejected by a relatively small force on the actuating member 40, and because the distance (stroke) traveled by the ejection section 64 is long, the memory card can be ejected from the frame 20 to a considerable degree.

Figure 6:
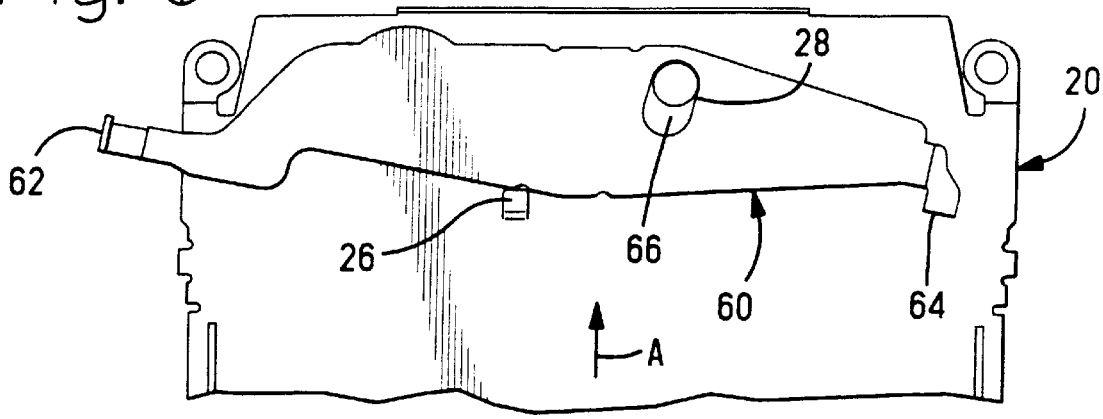
FIG. 6 shows the position of the card-ejection member when it commences returning to its initial position.

After the completion of the memory card ejection process, the force applied to the actuating member 40 (see FIG. 1) is released. Since the actuating member 40 is retracted by the spring 50 in the direction opposite to that of insertion, the card-ejection member 60 starts to return to its original position (the position shown in FIG. 3). At this time, as is illustrated in FIG. 6, the card-ejection member 60 while moving in the direction opposite to that of insertion, engages against the stop member 26, and the point of engagement between them becomes the axis of rotation and the card-ejection member 60 returns to its original position.

Figure 7:
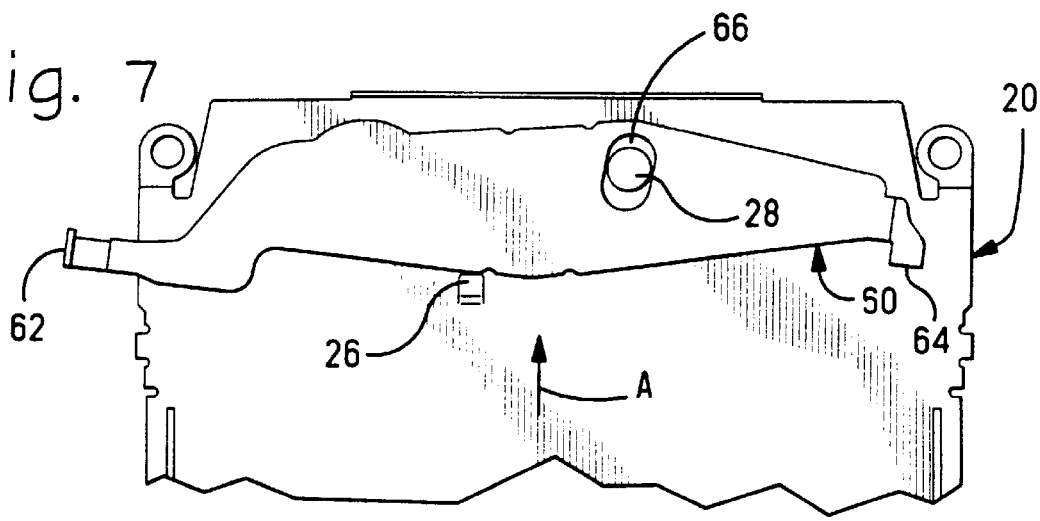
FIG. 7 shows the position of the card-ejection member midway to its initial position.
Figure 8:
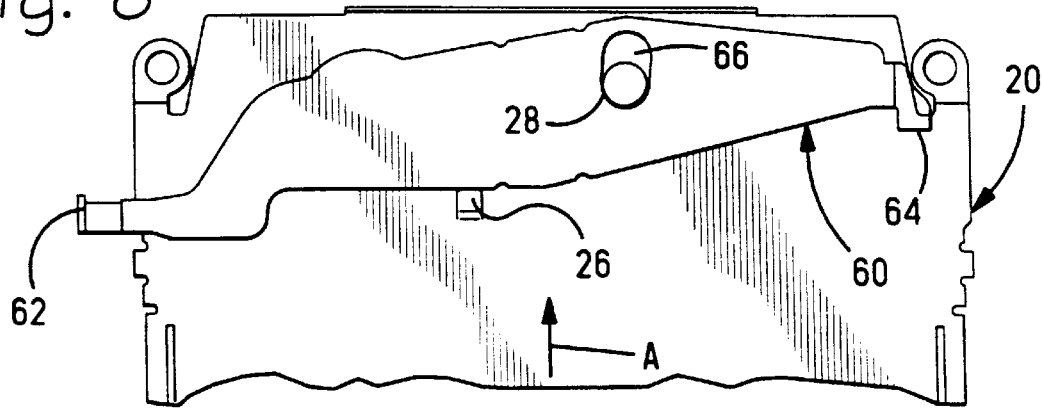
FIG. 8 shows the card-ejection member at its initial position.

When the card-ejection member 60 is returning to its original position while rotating around the engagement point of the card-ejecting member 60 and the stop member 26, as can be seen in FIG. 7, the card-ejecting member 60 starts to rotate with the elongated opening 66 being used as a guide. This rotation ends when the offset shoulder 28 engages against the rear end of the elongated opening 66. As illustrated in FIG. 8, the card-ejection member 60 returns to its original position without slipping out of place. Therefore, the ejecting section 64 is always in the proper position and it delivers a predetermined amount of ejection force without any special action on the part of the person operating the actuating member 40. Due to the fact that, as can be seen from FIG. 2*b*, the offset shoulder 28 formed from the frame 20 wraps around the edges 70 of the elongated opening 66, movement of the card-ejection member 60 does not lead to its deviation from the plane of rotation.

Figure 1A:
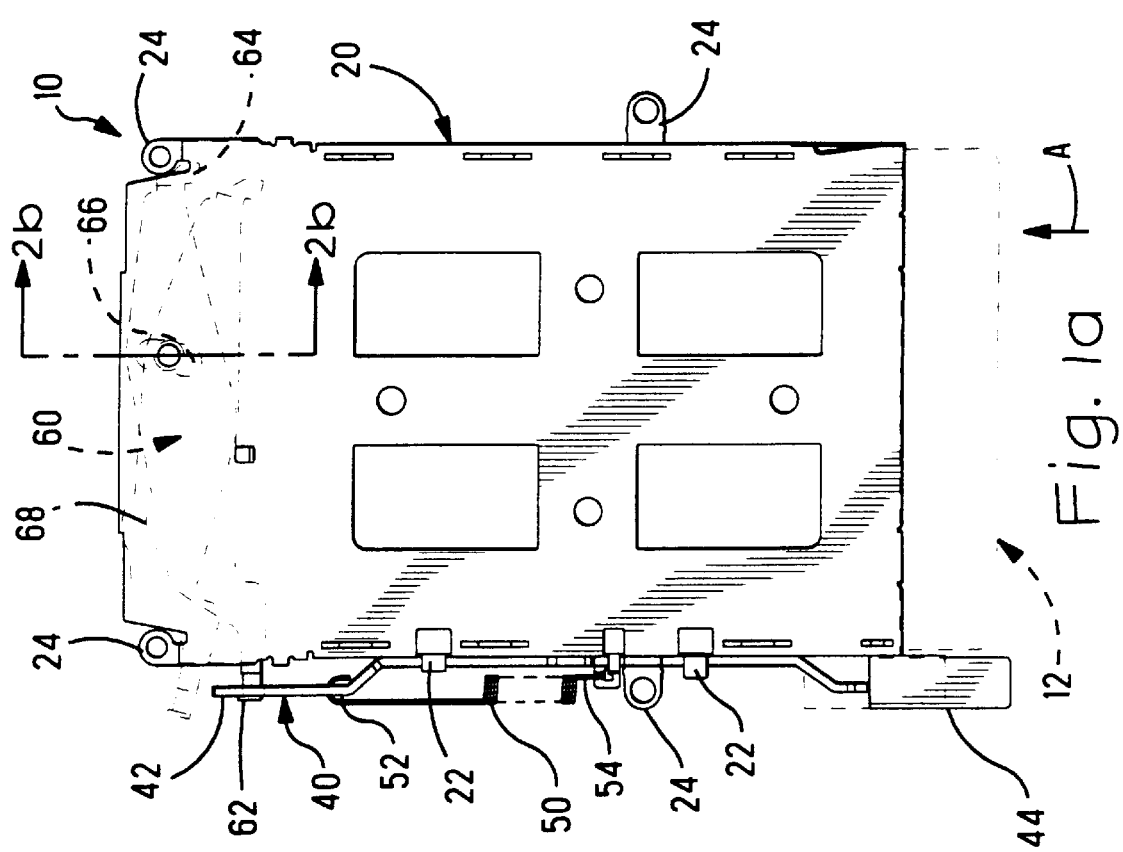
Figure 1B:
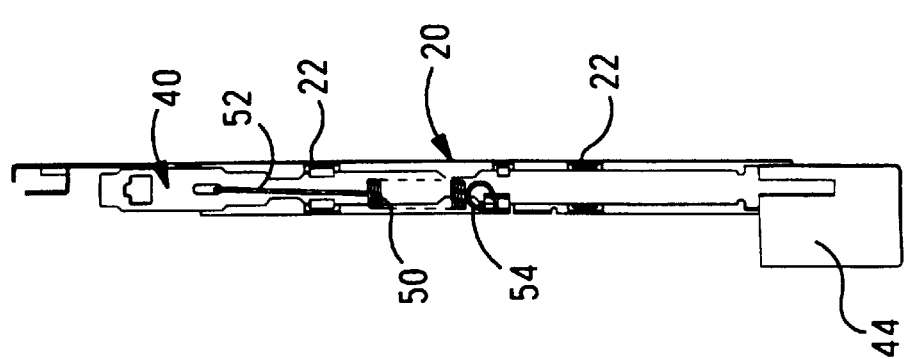

Next, an explanation concerning another embodiment of the memory card connector according to this invention will be given with reference to FIG. 9. FIG. 9 is an enlarged view of the memory card connector, all components corresponding to similar components of the memory card connector shown in FIG. 1 are denoted by the same numbers. Broken lines show the position of the card-ejection member when a memory card is inserted in the frame and insulating housing.

Memory card connector 100 has an elongated opening 112 in the card-ejection member 110 instead of an arcuate protrusions 68 as in the memory card connector shown in FIG. 1, and an offset shoulder 122 similar to the offset shoulder 28 (see FIG. 2) whose edges are wrapped around the edges of the opening 122. Therefore, in the memory card connector 100, the second stage of the card-ejection member rotation takes place around the offset shoulder 122 instead of the point of engagement between the arcuate protrusion 68 and the wall 30 as in the memory card connector 10. Since the card-ejection member rotation is controlled by offset shoulders 28 and 122, it is possible to prevent engagement of the card-ejection member 110 with the ground plate in the frame 120.

According to the above explanation, the memory card connector according to this invention has two separate axes of rotation, one for the initial stage and another for the second stage of rotation which can float in the elongated opening, thereby preventing the card-ejection member from slipping to an improper position and making it possible to appropriately eject the memory card. This also prevents deformation of the card-ejection member and it engages with the ground plate or other parts of the connector. At the same time, the operation of the connector is easier and more reliable.

We claim:

1. A memory card connector comprising a frame having a card-receiving area for receiving a memory card therein, an actuating member slidably mounted along one side of said frame, a card-ejection member pivotally mounted onto said frame at an inner end thereof and having one end connected to an inner end of said actuating member and an other end in the form of an ejecting section for engagement with the memory card to eject the memory card from the frame upon pivotal movement of said card-ejection member by said actuating member, characterized in that:

said card-ejection member has a primary floating axis of rotation orthogonal to said frame and said card-ejection member for an initial stage of rotation, said primary axis of rotation being located proximate said other end of said card-ejection member; and a secondary floating axis of rotation orthogonal to said frame and said card-ejection member for a second stage of rotation, said secondary axis of rotation being located proximate said one end of said card-ejection member; and wherein at least one of said primary floating axis and said secondary floating axis is comprised of a rolled inwardly portion of said frame forming an offset shoulder disposed in an elongated opening in said card ejection member.

2. The memory card connector as claimed in claim 1, wherein said primary floating axis and said secondary floating axis are disposed on each side of a central plane of said card-ejection member.

3. The memory card connector as claimed in claim 1, wherein said primary floating axis of rotation comprises a rolled inwardly portion of said frame forming an offset shoulder disposed in an elongated opening in said card-ejection member.

4. The memory card connector as claimed in claim 3, wherein said primary floating axis and said secondary floating axis are disposed on each side of a central plane of said card-ejection member.

5. The memory card connector as claimed in claim 1, wherein said secondary floating axis of rotation comprises a wall provided by said frame and an arcuate protrusion located at a forward edge of said card-ejection member.

6. The memory card connector as claimed in claim 5, wherein said primary floating axis and said secondary floating axis are disposed on each side of a central plane of said card-ejection member.

7. The memory card connector as claimed in claim 1, wherein said secondary floating axis of rotation comprises a rolled inwardly portion of said frame forming an offset shoulder disposed in an elongated opening in said card-ejection member.

8. The memory card connector as claimed in claim 7, wherein said primary floating axis and said secondary floating axis are disposed on each side of a central plane of said card-ejection member.

9. The memory card connector as claimed in claim 1, wherein a spring is connected between said actuating member and said frame to maintain said actuating member in an initial position.

* * * * *